(12) United States Patent
Dawley et al.

(10) Patent No.: US 9,912,018 B2
(45) Date of Patent: Mar. 6, 2018

(54) INTEGRATION OF A VOLTAGE SENSE TRACE FUSE INTO A BATTERY INTERCONNECT BOARD

(71) Applicant: GM Global Technology Operations LLC, Detroit, MI (US)

(72) Inventors: Evan J. Dawley, Lake Orion, MI (US); Glenn F. Carroll, Leonard, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 222 days.

(21) Appl. No.: 14/461,566

(22) Filed: Aug. 18, 2014

(65) Prior Publication Data

US 2014/0356671 A1  Dec. 4, 2014

Related U.S. Application Data

(63) Continuation-in-part of application No. 13/425,683, filed on Mar. 21, 2012.

(51) Int. Cl.
*H01M 10/48* (2006.01)
*G01R 31/36* (2006.01)
(Continued)

(52) U.S. Cl.
CPC ........ *H01M 10/482* (2013.01); *G01R 31/362* (2013.01); *G01R 31/3696* (2013.01);
(Continued)

(58) Field of Classification Search
CPC ............. H01M 10/04; H01M 10/0486; H01M 10/4207; G01R 31/362; G01R 31/3696
(Continued)

(56) References Cited

U.S. PATENT DOCUMENTS 6,346,011 B1 * 2/2002 Ikeda ........................... 439/627
2010/0089641 A1 4/2010 Esmaili et al.
(Continued)

FOREIGN PATENT DOCUMENTS

WO   WO 2012039514 A1 * 3/2012 ......... G01R 31/3696

OTHER PUBLICATIONS http://www.dictionary.com/browse/pocket, 2002, 2001, 1995, Houghton Mifflin Company.*

*Primary Examiner* — Jonathan Jelsma
*Assistant Examiner* — Rashid Alam
(74) *Attorney, Agent, or Firm* — Quinn IP Law (57) ABSTRACT

A battery pack, an integrated device for sensing individual battery voltage in a battery pack and a method of forming an integrated voltage-sensing circuit for use in a battery-powered automobile propulsion system. The integrated voltage-sensing circuit includes a busbar, a terminal pin and a voltage-sensing fuse electrically disposed between the busbar and the terminal pin. The construction of the voltage-sensing circuit is such that it forms an integral structure upon being coupled to the modular housing or related structure that may subsequently be secured to a frame that is used to provide support to each battery cell within the battery pack. In one form, the modular housing and voltage-sensing circuit may be secured to the frame during a frame molding process such that upon completion of the molding, the housing and at least a portion of the voltage-sensing circuit are encapsulated within the frame. In another form, the busbar or related voltage trace that signally couples each of the battery cells in a pack may be integrated into the frame, such as by overmolding.

12 Claims, 8 Drawing Sheets

(51) Int. Cl.
*H01M 2/10* (2006.01)
*H01M 2/20* (2006.01)
*H01M 10/42* (2006.01)
*H01M 10/04* (2006.01)

(52) U.S. Cl.
CPC ......... *H01M 2/1077* (2013.01); *H01M 2/206* (2013.01); *H01M 10/0413* (2013.01); *H01M 10/425* (2013.01); H01M 10/0486 (2013.01); H01M 2200/103 (2013.01); H01M 2220/20 (2013.01); *Y10T 29/49108* (2015.01)

(58) Field of Classification Search
USPC ...................................................... 429/90, 93
See application file for complete search history.

(56) References Cited

U.S. PATENT DOCUMENTS

| | | | |
|---|---|---|---|
| 2010/0108358 A1* | 5/2010 | Harazono | H01G 9/008 174/126.2 |
| 2010/0277958 A1 | 11/2010 | Campbell et al. | |
| 2010/0302733 A1 | 12/2010 | Woody et al. | |
| 2012/0019061 A1 | 1/2012 | Nishihara et al. | |
| 2012/0225327 A1* | 9/2012 | Ma et al. | 429/7 |

* cited by examiner

INTEGRATION OF A VOLTAGE SENSE TRACE FUSE INTO A BATTERY INTERCONNECT BOARD

STATEMENT OF RELATED CASES

This application is a Continuation-In-Part of U.S. application Ser. No. 13/425,683, filed Mar. 21, 2012, entitled INTEGRATED BUSBAR, TERMINAL PIN AND CIRCUIT PROTECTION FOR SENSING INDIVIDUAL BATTERY CELL VOLTAGE.

BACKGROUND OF THE INVENTION

This invention relates generally to voltage-sensing components used in conjunction with a battery-powered system, and more particularly to a device for and a method of integrating separate voltage-sensing components into a unified battery assembly as a way to increase assembly robustness and manufacturability of battery cell voltage-sensing components.

The increasing demand to improve vehicular fuel economy and reduce vehicular emissions has led to the development of both hybrid vehicles and pure electric vehicles. Pure electric vehicles may be powered by a battery pack (also called a battery), while hybrid vehicles include two or more energy sources, such as a gasoline (also referred to as an internal combustion) engine used as either a backup to or in cooperation with a battery pack. There are two broad versions of hybrid vehicles currently in use. In a first version (known as a charge-depleting hybrid architecture), the battery can be charged off a conventional electrical grid such as a 120 VAC or 240 VAC power line. In a second version (known as a charge-sustaining hybrid architecture), the battery receives all of its electrical charging from one or both of the internal combustion engine and regenerative braking. In either version, the battery pack is typically made from numerous modules, which in turn are made up of numerous individual cells. Numerous frames, trays, covers and related structure may be included to provide support for the various cells, modules and packs, and as such help to define a larger assembly of such cells, modules or packs.

In one form, the cells of the battery pack are configured as a rectangular (i.e., prismatic) can that defines a rigid outer housing known as a cell case that can be stacked (much like a deck of cards) along an axis formed by the aligned parallel plate-like surfaces. Positive and negative terminals situated on one edge on the cell case exterior are laterally-spaced relative to one another relative to the stacking axis and act as electrical contacts for connection (via busbar, for example) to an outside load or circuit. Within the cell case, numerous individual alternating positive and negative electrodes are spaced apart from one another along the stacking direction and kept electrically isolated by non-conductive separators. Leads from each of the negative electrodes are gathered together inside the cell case to feed the negative terminal, while leads from each of the positive electrodes are likewise gathered together to feed the positive terminal. In one form, each prismatic can cell delivers direct current (DC) electricity to the aforementioned loads, such as various vehicle systems, including motors, electric traction systems (ETS) or the like, as well as ancillary equipment. A power inverter is typically employed for components that need alternating current (AC) rather than DC power; these power inverters typically include capacitor modules and an integrated gate bipolar transistor (IGBT) for converting the DC input signal to an AC output signal. As mentioned above, in a common form, these modules are connected via busbar or cabling assemblies, where both the busbars and the related current-conveying components of the cell are typically made of copper, aluminum or alloys thereof. In some cases, the pins or related conductors may be coated with a thin layer of other metal to enhance corrosion resistance or other desirable properties.

The busbar is generally seen to be advantageous over cabling assemblies because (among other things) it—in addition to providing electrical connectivity—makes it possible to integrate voltage-sensing and monitoring electronics with the power connection via compact packaging. Furthermore, its general structure allows all of the terminals that are being used to provide electrical connection among the individual cells to be reliably and repeatably positioned relative to one another through a simple assembly operation. In one form, the monitoring (such as cell voltage-sensing) is typically accomplished using a circuit protection device (i.e., a circuit-protection fuse, often shortened to "fuse") as an electrical interface between the busbar and a terminal pin that is formed as part of the aforementioned frame that is used to provide structural support of the battery cell or cells.

An interconnect board (ICB) is a frame-like member that cooperates with the busbar to provide a mounting location for the circuit-protecting fuses and other circuit components. Despite the advantages of an ICB-based configuration, conventional busbars and their connection to ICBs suffer from certain drawbacks. These shortcomings are particularly acute when trying to connect the circuit-protection fuses and busbar to the ICB after it has already been molded or otherwise formed. First, in one common assembly approach, the busbar must be snap-fit or heat staked to the frame. The snap fit in particular is not a robust process and allows for too much positional variation. Second, resistance welding the small leads of the fuse to both the busbar and the terminal pin requires fine alignment and process windows, which are difficult to meet when incorporated into a larger part such as the ICB. Third, the fuse leads themselves may be exposed to mechanical loads; generally, the small leads of the fuse are not robust enough to function as both a mechanical and electrical link between the terminal and busbar. Thus, any errors or reduction in weld quality will influence throughput as the fuse leads eventually fatigue and fail. Likewise, these assembly difficulties result in a significant probability of failure and related production reject rate, thereby driving up production costs.

One particular ICB-to-busbar connection—the flex circuit-based approach—tend to use a large number of joints to achieve connection to the fuses; these joints (as well as other factors) make up a significant portion of the overall cost of a battery pack ICB. Furthermore, the fuses tend to be surface-mounted onto the flex circuit. While surface mounting is one of the only viable, cost-effective methods for attaching components to a flexible circuit, it can be problematic when the physical size of the fuse is large; such larger fuses are necessary to accommodate more severe fault conditions (such as those associated with automotive battery packs and other high voltage applications). In that event, a rigid circuit board is better suited for a larger fuse due to the mass of the component; however, these approaches tend to be bulky and expensive. Moreover, such connection schemes are particularly susceptible to durability issues in the areas where the busbar trace is attached to the U-shaped cell-mounting channels via an ultrasonic weld; these issues tend to be exacerbated when placed in a vibratory environment where fatigue issues may become significant. As such, there is a need for overcoming the shortcomings of these and other connection techniques.

SUMMARY OF THE INVENTION

In accordance with the teachings of the present invention, a method of forming an integrated circuit for use in a battery-powered automobile propulsion system is disclosed. The circuit includes a fuse with leads for establishing electrical communication between a busbar and a terminal pin. In a preferred form, there is a circuit for each cell within a larger battery pack or related assembly. In the present context, the circuit may be formed as part of a connector housing (also referred to herein more simply as housing) that in turn is permanently secured to or otherwise formed as part of the ICB or related frame; in either event, the integral nature of the connection between the frame and the voltage-sensing (also referred to herein as a voltage sense) circuit is such that being rigidly secured to one another, they are integral in functional sense, even if some visible indicia of their original separate nature may remain. As such, by being integrated into the frame within the present context, the voltage-sensing circuit becomes a structural whole, thereby exhibiting the enhanced structural robustness vis-à-vis the approach of the prior art, where separately-formed voltage-sensing circuits that are more vulnerable to repeated handling and related breakage-prone events are likely to occur. In particular, the combination of the busbar, fuse and terminal pin that make up the integrated voltage-sensing circuit are—once coupled to the housing—configured as a modular whole with and within the housing such that together the housing and the circuit define an autonomous part that is a structurally-robust integrated structure within itself, as well as when it is secured to the larger frame (such as by overmolding, encapsulation or the like) to become an integral part thereof.

In accordance with another aspect of the present invention, an assembly for sensing voltage produced by a battery cell within a battery pack made up of a plurality of battery cells is disclosed. As mentioned above, the assembled circuit provides the means to measure the voltage of each individual cell in a battery pack. The voltage-sensing circuit is made up of at least three components, including a terminal pin, cladded busbar and fuse (i.e. circuit protection) that are assembled together to fit in a modular housing that in turn may be secured to an ICB or battery frame. By integrating these electrically-conductive pieces within a housing and further integrating this housing into a frame (for example, an injection-molded frame), a greater robustness of all components can be realized. This is especially valuable for the fuse that links the terminal pin and busbar, as being part of a compact, modular housing that can withstand far more harsh handling treatment than can the fuse and related components individually.

In accordance with yet another aspect of the present invention, a battery pack configured to provide propulsive power to a vehicle is disclosed. The battery pack includes numerous battery cells, a frame for each battery cell to allow the cell to be secured and a voltage-sensing circuit secured to the frame, where the voltage-sensing circuit includes the aforementioned fuse, busbar and terminal pin, as well as a housing configured to maintain the fuse, the busbar and the terminal pin in electrical communication with one another. In one particular form, the housing defines a molded structure such that once the connection between the various electrically-conductive components are made, the voltage-sensing circuit defines a modular unit. As mentioned above, the molded structure of the housing is preferably further molded into the molded structure of frame; such molding, encapsulation, overmolding or the like ensures an integral connection between the housing and frame. In a preferred form, the shapes defined by the molded housing include various formations for receiving the electrically-conductive parts of the voltage-sensing circuit. It will be appreciated by those skilled in the art that the battery pack may include additional features for mechanical or electrical support, including additional frames, containers, cooling circuits or the like.

In accordance with still another aspect of the present invention, an assembly including an integrated circuit for use in a battery-powered automobile propulsion system is disclosed. The assembly can mechanically and electrically accept numerous prismatic battery cells into cell-receiving mounting channels formed in or on an ICB. A busbar that defines multiple individual signal-carrying lines is formed within the ICB and a coupling (which in a preferred form is an electrical monitoring connection header) to establish signal connection between each of the channels and the coupling through a respective one of the individual signal-carrying lines; in this way, each battery cell (or group of battery cells in configurations where there are multiple batteries in parallel such that the voltage is measured on the whole group) placed into a respective channel has a dedicated voltage sense circuit that can send voltage information pertaining to each cell through the busbar and on to cell monitoring or control circuitry through the coupling. Significantly, the busbar is integrally formed within the ICB, such as by overmolding. In a like manner, the channels may be integrally formed with the ICB. In this way, the fuses may be installed and electrically coupled to the respective signal-carrying lines only after the busbars and channels (which as described above are preferably are integrally formed within the ICB via overmolding) have been formed in the ICB. In this way, the connection of each fuse (such as by tin fusion, discussed below) is the last step in the formation of each voltage sense circuit. By integrally forming the busbar with the ICB (such as through overmolding or the like), a more robust assembly that is resistant to vibrations, handling and other damage-inducing conditions and environments may be produced.

In accordance with another aspect of the present invention, a battery pack configured to provide propulsive power to a vehicle is disclosed. The battery pack includes numerous prismatic battery cells aligned along a stacking axis to define a facing relationship between them. In addition, cell monitoring electronics, a cage configured to contain the plurality of cells and an assembly coupled to at least one of the cage and the cells are included. An ICB includes numerous battery cell-receiving mounting channels, as well as a coupling and busbar, the latter establishing signal connection between each of the channels and the coupling through a respective one of the individual signal-carrying lines. A voltage sense circuit is signally cooperative with each of the channels and a respective portion of the busbar, and is additionally formed within the ICB to include at least one fuse and at least one electrically-conductive line coupled to the fuse. Preferably, one or both of the busbar and channels are integrally formed with the ICB, such as by overmolding (in the case of the busbar) or co-molding (in the case of the channels). Pockets may be formed in the busbar, trace or terminal to facilitate a more comprehensive coupling of a fuse's lead line to the mating part on such busbar, trace or terminal. In the present context, the electrically-conductive line can either form a part of or be electrically connected to the pocket such that an axial lead that extends from the fuse can be readily coupled to the electrically-conductive line via resistance welding, tin fusion or the like. As discussed in conjunction with the companion application below, the tin fusion method is an especially valuable way to electrically connect the fuse to the trace, busbar, terminal or related electrically-conductive line that is formed within the ICB, as it significantly reduces damage to the leads that extend from the fuse. In addition to the features discussed above, it will be appreciated by those skilled in the art that the battery pack may include additional features for mechanical or electrical support, including additional frames, containers, cooling circuits or the like.

According to yet another aspect of the present invention, a method of providing electrical connectivity to an automotive propulsion system battery pack is disclosed. The method includes providing an ICB defining a plurality of battery cell mounting channels thereon, connecting cell monitoring electronics coupling to the ICB, and integrally forming a busbar with the ICB and the coupling to establish signal connection between them. The busbar is configured such that each of the channels has a dedicated signal connection to the coupling through a respective one of the individual signal-carrying lines. By signally connecting a voltage sense circuit to each of the channels and a respective portion of the busbar, each the voltage sense circuit formed within the ICB can be used to provide indicia of battery voltage deviations to the electrical monitoring communication circuits, as well as provide circuit protection through one or more fuses. At least the busbar and ICB are integrally formed, such as by overmolding. Fuse-configured apertures or related recesses may be integrally formed as part of the ICB overmolding to facilitate fuse placement and subsequent electrical connection.

BRIEF DESCRIPTION OF THE DRAWINGS

The following detailed description of specific embodiments can be best understood when read in conjunction with the following drawings, where like structure is indicated with like reference numerals and in which.

DETAILED DESCRIPTION OF THE PREFERRED EMBODIMENTS

Figure 1:
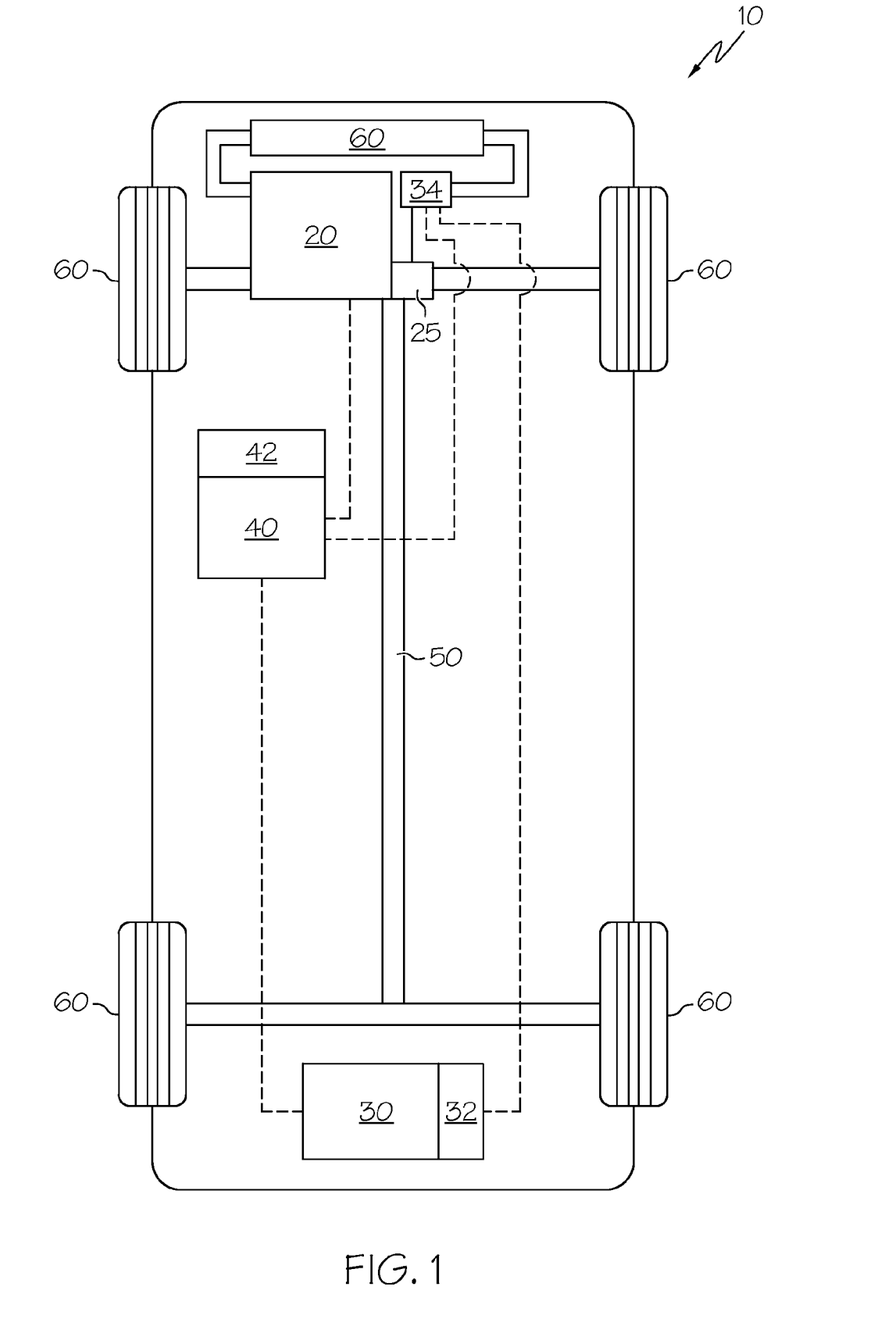
FIG. 1 is a schematic diagram of an exemplary vehicle configured with a hybrid power source, showing the integration of a battery pack with various other subcomponents of the vehicle.
Figure 6:
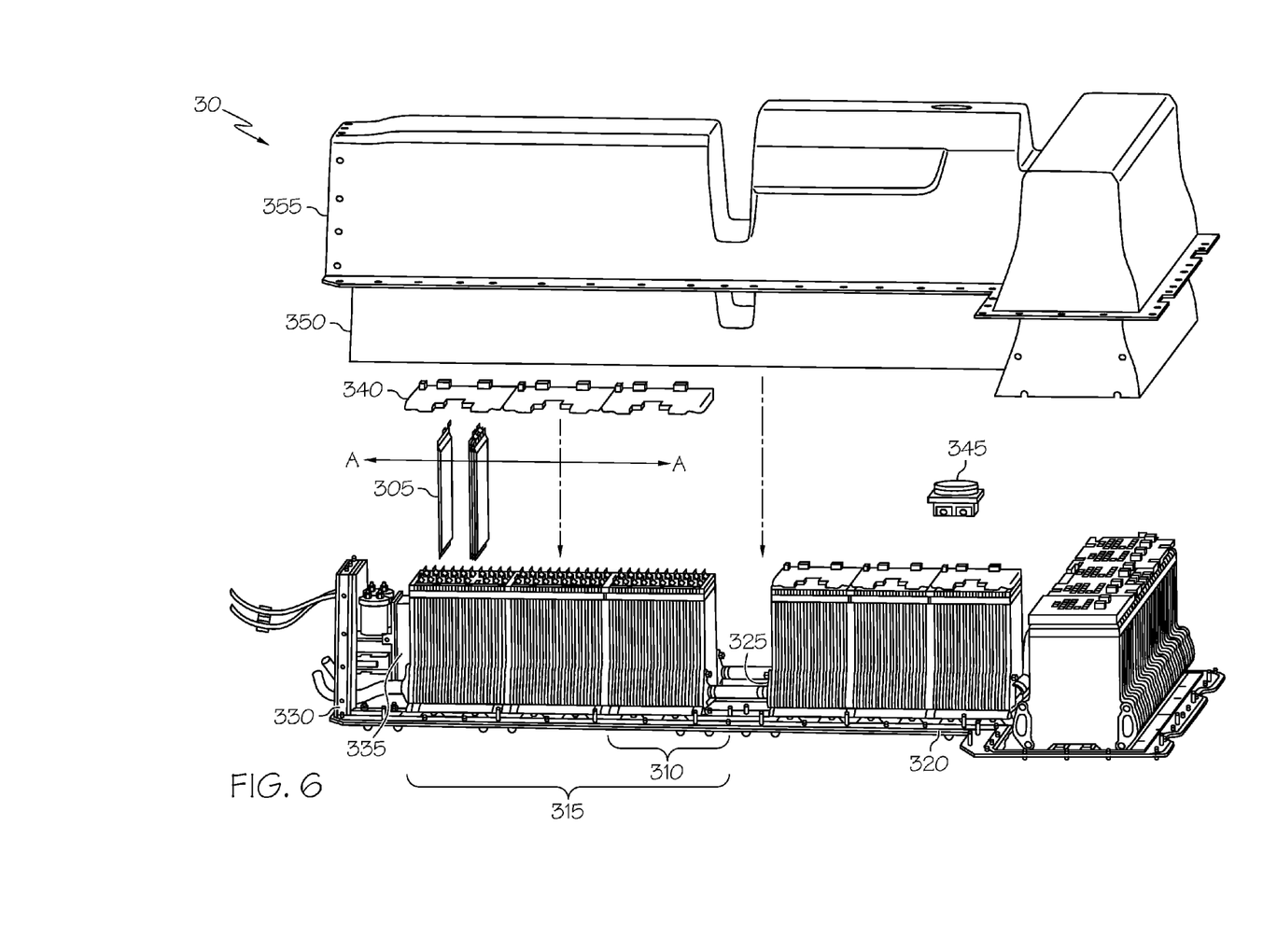
FIG. 6 is a simplified exploded view of a battery pack that can be used in the vehicle of FIG. 1.

Referring first to FIGS. 1, and 6, a schematic diagram of a hybrid-powered vehicle 10 in accordance with the present invention is shown. Within the present context, it will be appreciated that the term "vehicle" may apply to car, truck, van sport utility vehicle (SUV) or the like. Vehicle 10 includes an ICE 20, battery 30 (also referred to herein as battery pack, module or related to emphasize the assembled nature of multiple battery cells within) and an electronic control system 40, where one or both of ICE 20 and battery 30 may be coupled to an electric motor/generator 25. Vehicle 10 further includes a powertrain 50 (which could be in the form of a driveshaft or the like) to deliver propulsive power from the ICE 20, motor/generator 25 or battery 30 to one or more of the wheels 60. Battery 30 includes a state of charge (SOC) system 32 and power inverter assembly 34, the latter of which includes various modules, including those for the IGBT and capacitors (not shown) as well as other conductive elements configured to provide a pathway for current flow between these and other associated battery-related electronic components. Busbar assemblies (portions of which are shown and discussed in more detail below) provide compact, reliable electrical connection between these various modules. Additional support equipment, such as radiator 70, is also shown. Although the battery 30 (which as discussed above may be placed in a frame as part of a larger assembly) is shown in the rear of vehicle 10, it may be located in any suitable location to facilitate its electrical coupling (via busbars discussed in more detail below) to the various electrical components. In one embodiment, battery 30 is an assembly or pack made up of numerous lithium ion (Li-ion) cells (not individually shown). The electronic control system 40 may include a variable motor drive module 42 to control electric motor torque and speed, as well as other vehicular functions. It will be appreciated by those skilled in the art that while vehicle 10 is presently shown as a hybrid-powered vehicle, that one with purely electric power (i.e., one with no need for ICE 20) is also deemed to be within the scope of the present invention.

Referring with particularity to FIG. 6, details associated with battery pack 30 are shown in a partially-exploded view. Depending on the power output desired, numerous battery cells 305 may be formed along stacking axis A-A into modules 310 that may be combined as a group or section 315; such may be aligned to be supported by a common tray 320 that can also act as support for coolant hoses 325 that can be used in configurations where supplemental cooling may be desired. A bulkhead 330 may define a primary support structure that can function as an interface for the coolant hoses 325, as well as house a battery disconnect unit in the event battery service is required. In addition to providing support for the numerous battery modules 310, tray 320 and bulkhead 330 may support other modules, such as a voltage, current and temperature measuring module (VITM) 335 (which acts as a centralized "brain" to aggregate the individual cell voltage information via local network (not shown)). Placement of individual battery cells 305 (to be discussed in more detail below) within one of battery modules 310 is shown, as is the covering thereof by an ICB 340. A separate voltage and temperature module (VTSM (not shown)) may be made to sit atop each of the three main battery sections 315 that make up the T-shaped pack 30 to communicate cell voltages from each ICB 340 to the VITM 335. Variations on this busbar used to provide electrical interconnect functions between various cells 305 and one or more of electrical monitoring or control equipment will be discussed in more detail below. Other features, such as manual service disconnect 345, insulation 350 and a cover 355 complete the battery pack 30.

Figure 7:
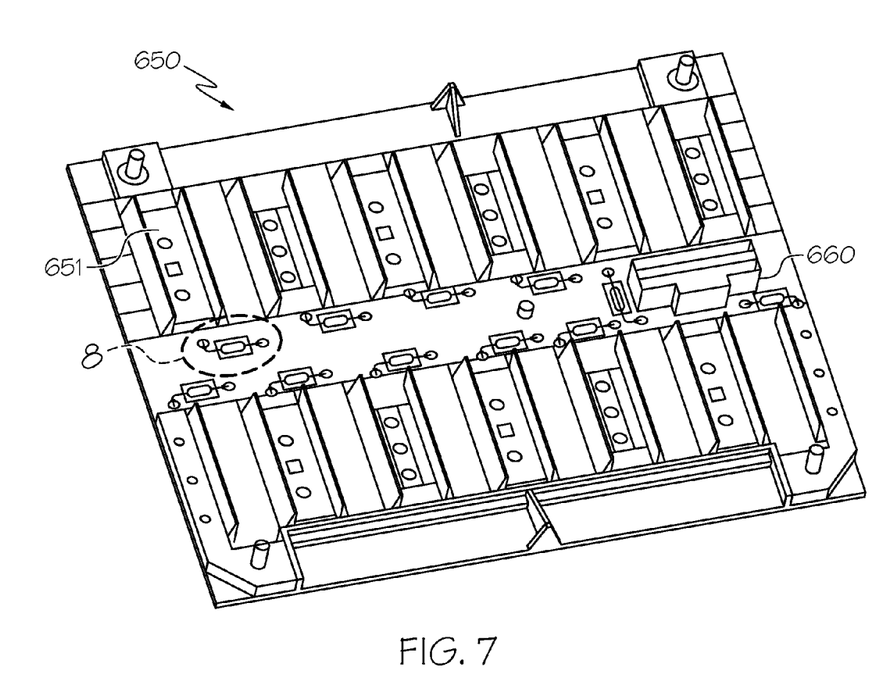
FIG. 7 shows a top perspective view of an ICB that shows fuses incorporated into the voltage sensing circuit between the busbars and terminal pins according to an aspect of the present invention.

In one typical example, battery pack 30 may include about two hundred to three hundred individual battery cells 305, although (like the arrangement) the number of cells 305 may be greater or fewer, depending on the power needs of the vehicle 10 and its electronic control system 40. In a preferred form, the cells 305 define a rigid, rectangular (i.e., prismatic) shape. In a more particular form, the cells 305 are of the prismatic pouch variety rather than the prismatic can variety. Placement of individual battery cells 305 within battery pack 30 is shown, while the ICB 650 (that is shown in FIG. 7 and discussed in more detail below) may be placed above or below the aligned cells 305 in order to provide both cell 305 mounting and electrical monitoring and control functions. In the present context, the terms "battery cell", "battery module" and "battery pack" (as well as their shortened variants "cell", "module" and "pack") are use to describe different levels of components of an overall battery-based power system, as well as their assembly. For example, numerous individual battery cells 305 are stacked in a face-to-face relationship along a stacking axis A-A such that their edges substantially align to define a generally rectangular shape. These cells 305 form the building blocks of battery modules (in conjunction with ancillary equipment) 310 that in turn make up the completed battery pack 30. The usage of one or more of such terms will be apparent from the context. The various battery cells and modules may be aligned as shown to be supported by a common tray that can also act as support for coolant hoses, headers, manifolds or related conduit where supplemental cooling may be desired.

Figure 2A:
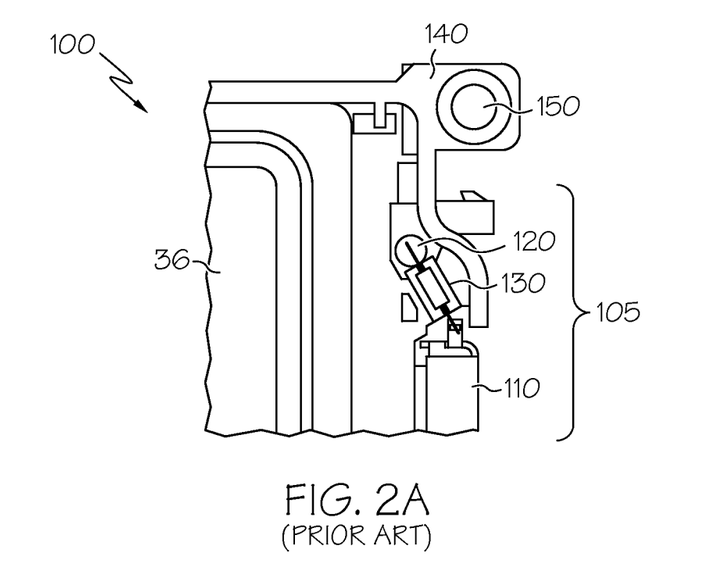
FIGS. 2A and 2B show respective top and elevation views of the connection between a busbar, terminal pin and fuse of a voltage-sensing circuit according to the prior art.
Figure 2B:
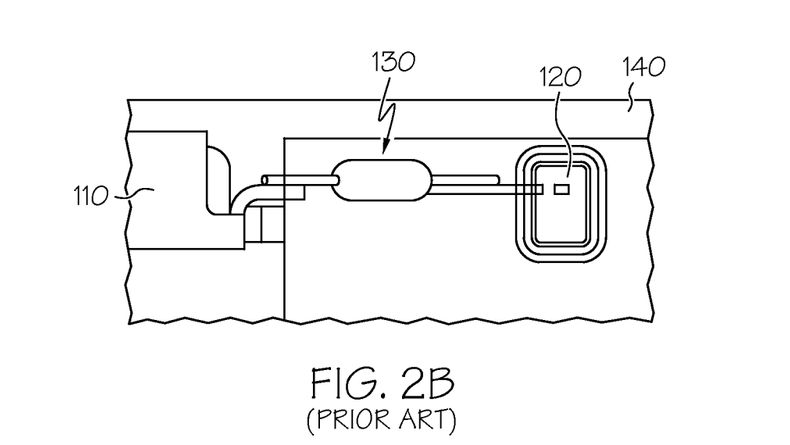

Referring next to FIGS. 2A and 2B, details depicting a portion of a notional prior art busbar subassembly 100 (FIG. 2A) and voltage-sensing circuit 105 made up of the connection between a busbar 110 and terminal pin 120 through a fuse 130 is shown. In particular, the various components making up the voltage-sensing circuit 105 are directly attached to a portion of frame 140 that is used to provide mechanical or structural support for these and other components. Furthermore, additional components, such as battery cell-supporting tray 36, are preferably sized to structurally cooperate with frame 140. In one form, the frame 140 is about ten inches (i.e., about 250 millimeters) in length along its longest edge and further includes apertures 150 formed therein to promote connection through a bolt or related fastener (not shown). It will be appreciated by those skilled in the art that only a small part of frame 140 is shown, where numerous such frames 140 (with mounted cells 36 and voltage-sensing circuits 105) are stacked or otherwise arranged to provide a mechanically rigid pathway to facilitate the flow of current from the individual battery cells 36 to the various power-consuming components in vehicle 10. Depending on the configuration, other components (not shown) of each individual busbar subassembly 100 may include a positive DC terminal and a negative DC terminal, as well as numerous other components to establish electrical connectivity between the positive and negative terminals of the individual battery cells, as well as to other components of battery 30. It should be noted that any DC-to-AC conversion takes place outside the battery pack, and is not presently shown. Each busbar subassembly 100 transfers current received from the positive and negative terminals of the DC source (i.e., battery cell 36) to (among other components) IGBT devices, power diodes or other components that can either convert the DC signal to a single-phase AC signal. As mentioned above, in one form, at least the electrically-conductive portions of busbar subassembly 100 may be made from copper or a copper alloy, and may additionally be plated.

Upon stacking and connecting the various individual frames 140, a structural assembly resembling a substantially complete battery pack (such as battery 30) is formed. As mentioned above, each battery cell within battery 30 is mounted to a corresponding frame 140 that includes a mounting location where fuse 130 may be secured to the busbar 110 and terminal pin 120. In one particular form, a chassis or related larger container (not shown) may also be used to provide enclosure and related environmental protection for not only the battery 30, but also the internal electronic components, such as those that make up the power inverter assembly 34; such an additional container may be made from a suitable material with conductive features that can be grounded to the chassis of vehicle 10 to provide a ground source for housed electrical components.

The above approach to battery 30 construction necessitates that each voltage-sensing circuit 105 in general—and each fuse 130 in particular—be picked and placed onto the frame 140; furthermore the electrical leads (which are typically very small—for example—0.6 millimeter in diameter) of fuse 130 need to be aligned with the terminal pin 120 and busbar 110 for proper resistance welding. The manipulation of objects with disparate scales (specifically, the large scale of frame 140 and the much smaller scale of fuse 130) increases complexity of the assembling process, as movements deemed fine-motor within the larger scale may be far too coarse for the particular needs of the fuse 130 and its fragile leads. This in turn leads to potential handling or process-related damage to the voltage-sensing circuit 105.

Figure 3A:
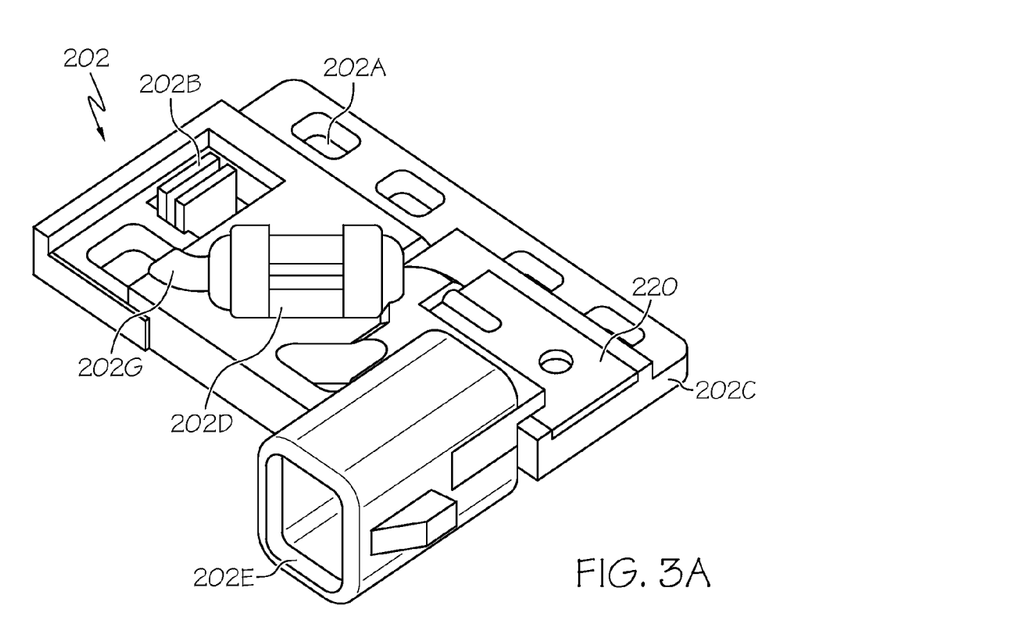
FIG. 3A shows the molded housing with the terminal pin placed therein according to an aspect of the present invention.
Figure 3B:
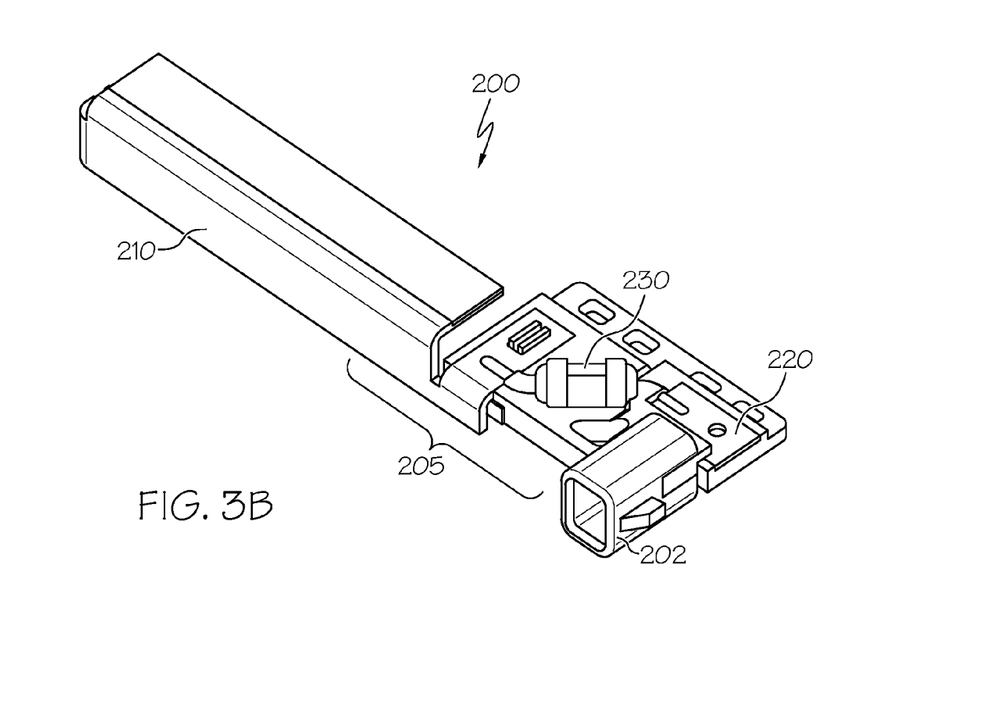
FIG. 3B shows the housing of FIG. 3A connected to the busbar and fuse to define a modular, integral voltage-sensing circuit according to an aspect of the present invention.

Referring next to FIGS. 3A, 3B, 4A, 4B, 5A and 5B, the various components making up a voltage-sensing circuit subassembly 200 (also referred to herein as assembly) according to an aspect of the present invention are shown. Referring first to FIGS. 3A and 3B, the subassembly 200 includes a housing 202 for containing the voltage-sensing circuit 205 as a way to reduce complexity, process variability and cost by having at least the busbar 210 and terminal pin 220 be integrally-formed within the housing 202 that will in turn be integrally formed (such as by overmolding or encapsulation) with a frame (such as frame 240) such that placement and alignment of fuse 230 is achieved with a significant reduction in the risk of damage. Various formations are defined in housing 202, including apertures 202A that permit liquid forms of molded frame material (for example, polypropylene) to pass through such that upon solidification, they form a permanent, integral connection between the frame 240 and housing 202. Other formations, such as 202B, 202C and 202D are used to define spaces where the busbar 210, terminal pin 220 and fuse 230, respectively may be mounted or otherwise placed. Likewise, connector 202E may be used to define a mounting location for other equipment that makes up, or is otherwise connected to, the frame 240. Formation 202G defines a bent path (shown notionally as being roughly serpentine) to allow the leads from fuse 210 to be attached to complementary surfaces on the busbar 210 and terminal pin 220. FIG. 3B shows with particularity how the housing 202 and the entirety of the busbar 210 form the voltage-sensing circuit subassembly 200. In one form of construction, the terminal pin 220 is placed in a mold—which may be a pre-defined slot or related shape formed in the housing 202, while the busbar 210 may be joined to the housing through appropriate connection. In any event, once the busbar subassembly 200 is formed, the fuse 230 may be inserted into the cavity or related indentation corresponding to formation 202D. As mentioned above, the electrically-conductive nature of the busbar 210 and terminal pin 220 is such that when secured to corresponding electrically-conductive leads 234, 232 of fuse 230, they form an electrically-continuous circuit 205. In particular, shaped portions 201D and 230A formed in the busbar 210 and terminal pin 220 respectively are sized to promote secure connection between the small-diameter leads 234, 232 of fuse 230. In one form, the connection may be through appropriate mechanical means, such as snap-fit, heat staking or the like, while electrical connection may be accomplished through resistance welding or another joining method to establish the fuse joints discussed below.

Figure 4A:
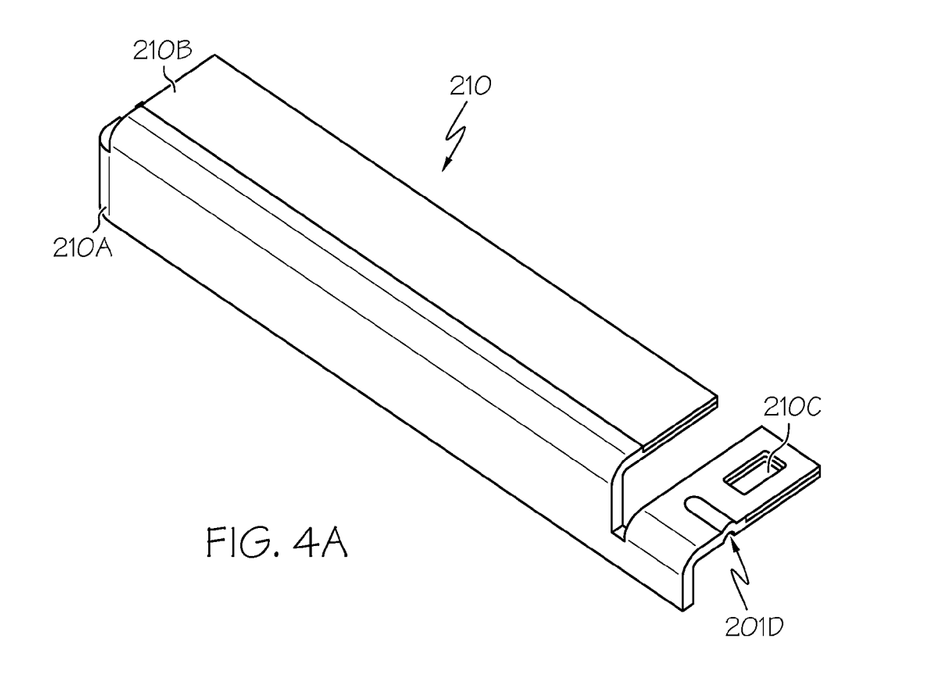
FIG. 4A shows the busbar of FIG. 3B in isolation.
Figure 4B:
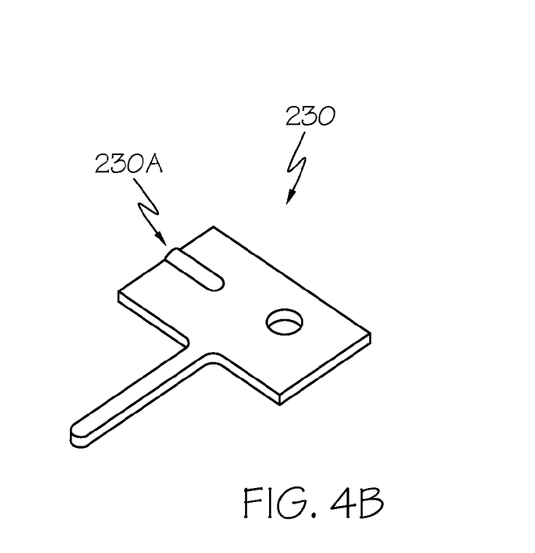
FIG. 4B shows the terminal pin of FIGS. 3A and 3B in isolation.

Referring with particularity to FIGS. 4A and 4B, the busbar 210 includes a generally conductive face 210A made from a copper alloy secured to a backing 210B made from an aluminum alloy. Aperture 210C is sized to cooperate with the detent-shaped formation 202B of the housing 202 of FIG. 3A.

Figure 5A:
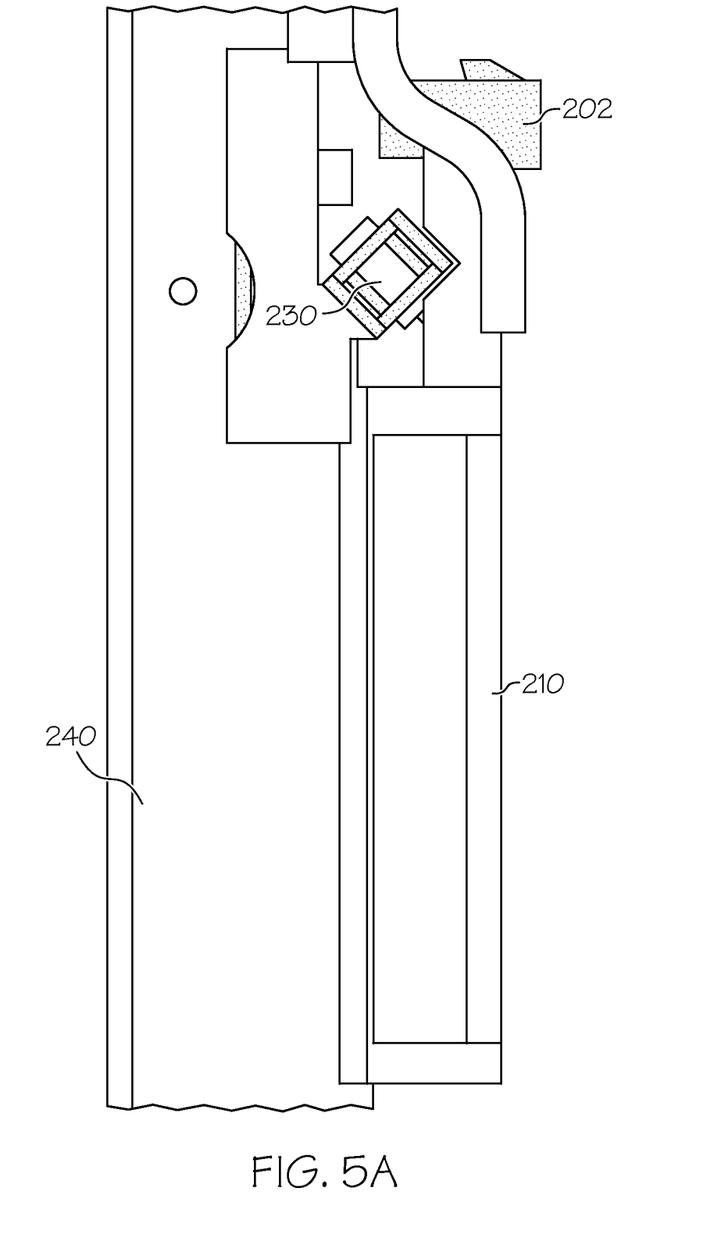
FIG. 5A shows a view from one side of the integration of the modular, integral voltage-sensing circuit of FIG. 3B into a portion of a battery cell frame.
Figure 5B:
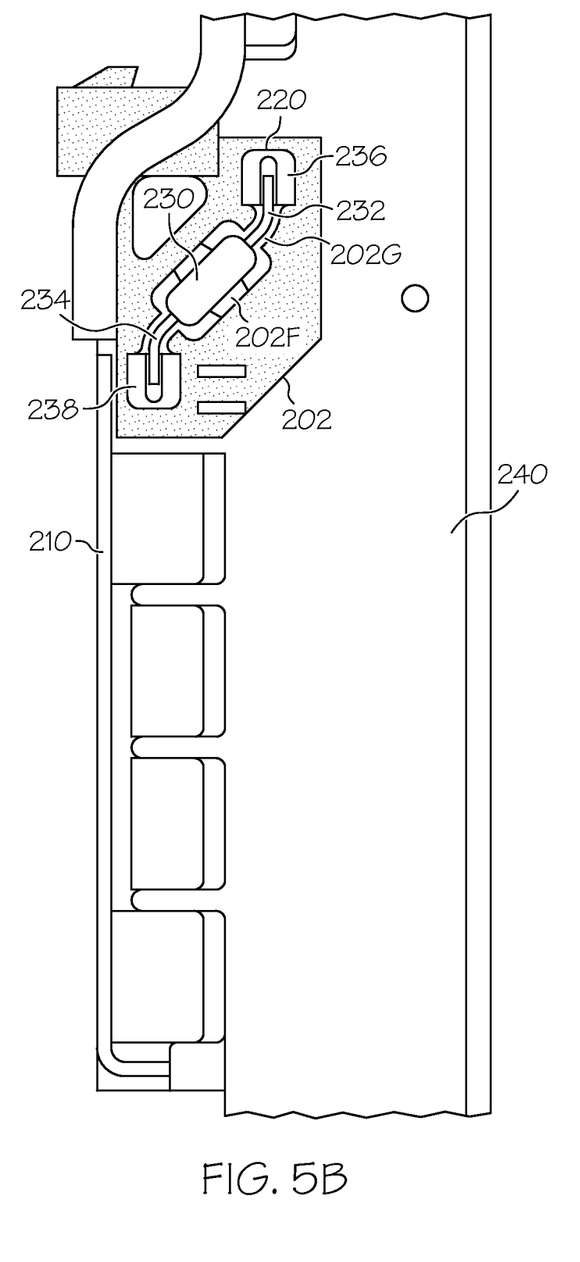
FIG. 5B shows a view from the opposing side of the integrated voltage-sensing circuit of FIG. 5A.

Referring with particularity to FIGS. 5A and 5B, the integration of the frame 240 and the housing 202 is shown, where surface details are added to the latter to better emphasize initial lines of demarcation between the two structures. Unlike the prior art, the voltage-sensing circuit 205, by virtue of its integrated construction within housing 202, voltage-sensing circuit subassembly 200 and frame 240, has an increased resistance to environmental and mechanical loading, thus reducing the probability of a failure. The construction of the voltage-sensing circuit 205 is such that at least the locations within housing 202 where the fuse 230 and its leads 232, 234 are placed forms an integral structure that may subsequently be secured to frame 240. Thus in one form, the modular housing 202 and voltage-sensing circuit 205 may be secured to the frame 240 during a molding process of the frame 240 such that upon completion of the molding, the housing 202 and at least a portion of the voltage-sensing circuit 205 are encapsulated within the frame 240.

Referring with even more particularity to FIG. 5B, the fuse 230 (in general) and the fuse joints 236, 238 formed between the leads 232, 234 and their corresponding connection points on the respective terminal pin 220 and busbar 210 (in particular) are especially vulnerable to damage that can occur during normal fabrication and handling. Leads 232 and 234 extending from opposing ends of fuse 230 provide electrical connectivity to the terminal pin 220 and busbar 210, respectively, preferably through a resistance welding process. By having both properly-sized resilient connections and precision alignment between the leads 232 and 234, the fuse 230 may be secured to the housing 202 and the remainder of the busbar subassembly 200 with a higher degree of confidence that subsequent frame-handling (i.e., large-scale) operations will not exploit minute differences in small-scale misalignments within the fuse 230, busbar 210 and terminal pin 220 to jeopardize reliable fabrication of the voltage-sensing circuit 205. In a particular form, at least a significant portion of the busbar 210 and terminal pin 220 are encapsulated by the plastic of the frame 240 during the overmold process, while fuse 230 is preferably left substantially uncovered by the material of the frame 240. As can be seen in both of the present figures, there is significant coverage of the connection between the busbar 210 and the housing 202, as well as between the terminal pin 220 and the housing 202, while the fuse 230 and its leads 232, 234 remain substantially uncovered. The cavity or related indentation 202D (as best shown in FIG. 3A) in housing 202 has integrally-formed tabs or detents 202F to allow the fuse 230 to be securely snap-fit into place, while the serpentine walls 202G promote secure alignment of the leads 232, 234 to the respective contact surfaces of terminal pin 220 and busbar 210.

In one form, the fuse joints 236, 238 formed between the leads 232, 234 and their corresponding connection points on the respective terminal pin 220 and busbar 210 may be done through resistance welding. The tolerances that a smaller assembly (such as that which fits within or otherwise cooperates with housing 202) makes possible are a good fit with the dimensions of the fuse 230 and the demands of resistance welding. Furthermore, the compact, modular nature of housing 202 allows a fuse 230 secured thereto to be handled in a manner more consistent with the larger-scale structure of frame 240. Likewise, the present design of housing 202 is easily integrated within the host frame 240 by overmolding, thereby increasing structural continuity and related overall robustness and manufacturability.

By the present construction, the order of assembly of the present invention is the opposite of that of the prior art where the three electrically-connected components 110, 120 and 130 of the voltage-sensing circuit 105 are assembled after the molding or forming of the battery cell frame 140, whereas in the present invention, the components 210, 220 and 230 are combined in a single standalone unit before molding the battery cell frame 240. This enhances circuit 205 integrity by providing a built-in carrier in the form of housing 202 (at a first, more modular level) and the larger assembly 200 (at a second, slightly larger level). Furthermore, by using an overmolding process to secure the housing 202 or assembly 200 to the frame 240, at least the busbar 210, transfer pin 220 and their respective interconnects to the housing 202 are secured in place with a barrier to the ambient environment.

Figure 8:
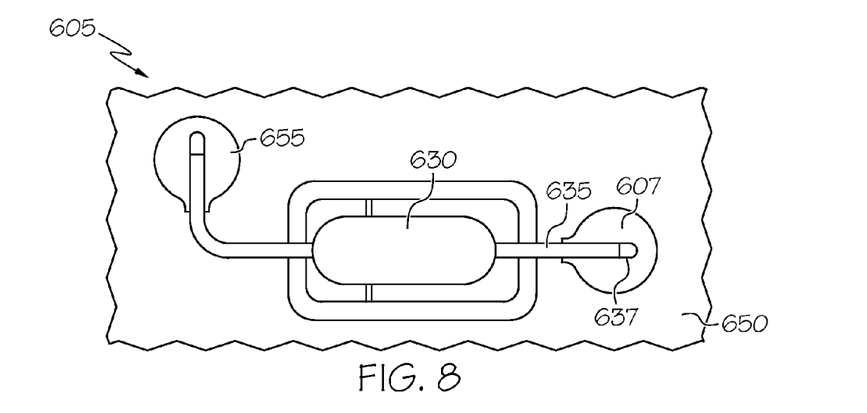
FIG. 8 shows a detail view of the voltage sense circuit of Section 8 of FIG. 7.

Referring next to FIGS. 7 and 8, ICB 650 uses overmolding to achieve electrical isolation between and structural support for the busbars 651, voltage sensing traces (also referred to as terminal pin trace) 607 that lead to the terminal pins contained in connector header 660, and the fuses 630 that are between the two. As mentioned elsewhere in this disclosure, the above components make up the voltage-sensing circuit 105 that acts as an interface to external electrical monitoring or control equipment (such as the aforementioned temperature measuring module 335 or voltage and temperature sub-module 340, among others). ICB 650 is in the form of a modular assembly that in turn is installed to engage the corresponding edge of the pack 30 of FIG. 6. Unlike the embodiment depicted in FIGS. 3A through 5B (where integration takes place via separate module or housing 202 that can be snap-fit or otherwise connected to the ICB-like frame 240), the integration of at least the busbar 651 (as well as possible integration of portions of the voltage-sensing circuit 605 that is discussed below in conjunction with FIG. 8) is by some form of unitary construction (such as by overmolding of the ICB 650). Such construction reduces part count, as well as makes the voltage-sensing circuit 605 more resistant to subsequent component fabrication and assembly, as well as provides enhanced resistance to vibration-induced loading. This benefit is especially prevalent over the flex circuit approach of the prior art in that fewer joints are required. Likewise, the use of a coupling in the form of the connection header 660 to act as a junction box for electrical monitoring circuitry according to an aspect of the present invention is more robust than one that of the snap-fit approach used on the flex circuit design.

Referring with particularity to FIG. 8, the voltage-sensing circuit 605 is made up of at least circuit-protecting fuse 630 and a electrically-conductive line in the form of a generally cylindrical-shaped axial lead 635 that can be mated to the terminal pin trace 607 that serves as the contact point for fuse 630 to a terminal pin that is contained in the header 660 that all fit into the ICB 650. By integrating at least some of these electrically-conductive pieces into a singular whole within ICB 650, a greater robustness of all assembled components can be realized. This is especially valuable for helping the fuse 630 and its leads 635 withstand far more harsh assembly and subsequent handling and use treatment than if the fuse 630 and related components were individually assembled. In a preferred form, the leads 635 from the fuse 630 are welded or otherwise permanently joined to the traces or terminal pin trace 607. An aperture or related recess 655 formed into the portion of ICB 650 that forms the overmolding ensures ease of assembly tool access, while a pocket 637 provides a secure placement location and subsequent fit between the fuse 630 and the ICB 650. In a preferred form, there is a circuit 605 for each cell 305 within a larger battery pack 30 such that the circuit 605 provides the means to measure when a voltage fluctuation occurs with each individual cell 305.

As mentioned above, one technique for joining the fuses 630 to voltage sense traces or terminal pins 607 (or other electrically-conductive lines) formed in the ICB 650 is the tin fusion method. In this method (which was developed by one of the present inventors under U.S. patent application Ser. No. 14/461,583 entitled TIN FUSION JOINING FOR ROBUST INTEGRATION OF ELECTRICAL COMPONENTS WITH AXIAL LEADS that is commonly-owned by the Assignee of the present invention and hereby incorporated by reference in its entirety), the fuse 630 may be secured to the ICB 650, and then subjected to a specialized welding process as a way to reduce stresses and related fatigue or fracture-based joint failures. Specifically, a pocket formed into a stamped lead-receiving component provides for the joining process while limiting the deformation of the axial leads, while the residual tin that forms at the part of the interface not associated with the coalescing solid state diffusion bond fills the voids in the stamped pocket to provide a more spread-out area with which the joint may support mechanical (including vibratory) loads. Thus, by placing the round axial lead of a first electrical component into a pocket formed within a stamped mating second component, at least a portion of the first component can be made to sit below the datum surface of the second component and provide greater contact area. Moreover, when subjected to a resistance welding process, the Joule heat generated by the electrical pulse that passes through the welder's electrodes not only melts the tin plating at the interface between the two components where the diffusion bonding occurs, but realizes a reduced amount of out-of-roundness deformation by virtue of its substantial containment within the pocket of the second component. This in turn reduces the amount of the stress riser created as a result of the resistance welder's applied force. As such, the depth of the pocket is at least a significant contributor to controlling the degree of the stress riser. The presence of the molten tin helps to fuse the component together at the onset of the electrical pulse; moreover, since molten tin is soluble in copper, only a short amount of time (for example, a few milliseconds) is required in order to form a good diffusion bond between the copper core of the joined components.

Other processes besides the tin fusion method mentioned above, such as traditional welding, soldering or related electrical joining approaches, may be used in the alternative. For example, a resistance spot welder may be used to melt the tin coating onto the mating leads 635 or terminal pin traces 607. Furthermore, by forming bends (shown presently as 90°, although it will be appreciated by those skilled in the art that other angles may also be employed) in the leads 635, augmentations in strain relief in response to thermal growth and contraction issues may be enhanced. In addition, by leaving fuse 630 exposed (i.e., not overmolded), thermal expansion and contraction issues are further avoided. Likewise, the exaggerated aperture sizes 655 formed into the ICB 650 overmolding promote ease of insertion of the tip or electrode of the resistance welder (neither of which are shown).

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Likewise, for the purposes of describing and defining the present invention it is noted that the term "substantially" is utilized herein to represent the inherent degree of uncertainty that may be attributed to any quantitative comparison, value, measurement, or other representation. The term is also utilized herein to represent the degree by which a quantitative representation may vary from a stated reference without resulting in a change in the basic function of the subject matter at issue.

For the purposes of describing and defining the present invention it is noted that the terms "battery", "battery pack" or the like are utilized herein to represent a combination of individual battery cells used to provide electric current, preferably for vehicular, propulsive or related purposes. Furthermore, variations on the terms "automobile", "automotive", "vehicular" or the like are meant to be construed generically unless the context dictates otherwise. As such, reference to an automobile will be understood to cover cars, trucks, buses, motorcycles and other similar modes of transportation unless more particularly recited in context.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. An assembly for sensing voltage produced by a prismatic battery cell within a battery pack made up of a plurality of the prismatic battery cells, the assembly comprising:

an interconnect board defining a plurality of cell mounting channels thereon;
a coupling secured to the interconnect board; and
a modular subassembly comprising:
a housing;

a busbar secured to the housing and defining a plurality of individual signal-carrying lines therein, the busbar formed within the interconnect board and cooperative with the coupling to establish signal connection between the coupling and each of the plurality of cell mounting channels through a respective one of the plurality of individual signal-carrying lines; and a voltage sense circuit formed within the housing and signally cooperative with each of the plurality of cell mounting channels and a respective portion of the busbar, the voltage sense circuit comprising at least one fuse having an axial lead and at least one electrically-conductive line coupled thereto via tin fusion, wherein the interconnect board defines a pocket to receive the axial lead.

2. The assembly of claim 1, wherein the coupling comprises an electrical monitoring connection header.

3. The assembly of claim 1, wherein the interconnect board is overmolded relative to the busbar to define an integral formation therebetween.

4. The assembly of claim 1, wherein each of the plurality of cell mounting channels is secured to the voltage sense circuit with an ultrasonic weld.

5. The assembly of claim 1, wherein the interconnect board is formed from an electrically non-conductive material.

6. The assembly of claim 1, wherein the plurality of cell mounting channels is integrally formed within the interconnect board.

7. The assembly of claim 1, wherein the interconnect board defines a fuse-accepting pocket formed therein to receive the at least one fuse.

8. The assembly of claim 7, wherein the at least one electrically-conductive line is integrally formed within the interconnect board.

9. The assembly of claim 7, wherein the fuse-accepting pocket is further configured such that, upon placement of the at least one fuse into the fuse-accepting pocket, the at least one electrically-conductive line extends from the at least one fuse and terminates on a location on the interconnect board defined by apertures.

10. A battery pack configured to provide propulsive power to a vehicle, the battery pack comprising:

a plurality of prismatic battery cells aligned along a stacking axis to define a facing relationship thereby;

cell monitoring electronics;

a cage configured to contain the plurality of prismatic battery cells therein; and an assembly coupled to at least one of the cage and the plurality of prismatic battery cells and comprising:

an interconnect board defining a plurality of battery cell-receiving mounting channels thereon;

a coupling connected to the interconnect board and the cell monitoring electronics; and a modular subassembly comprising:

a housing;

a busbar secured to the housing and defining a plurality of individual signal-carrying lines therein, the busbar formed within the interconnect board and cooperative with the coupling to establish signal connection between each of the plurality of battery cell-receiving mounting channels and the coupling through a respective one of the individual signal-carrying lines; and a voltage sense circuit formed within the housing and signally cooperative with each of the plurality of battery cell-receiving mounting channels and a respective portion of the busbar, each the voltage sense circuit comprising at least one fuse having an axial lead and at least one electrically-conductive line coupled thereto via tin fusion, wherein the interconnect board defines a pocket to receive the axial lead of the at least one fuse.

11. The battery pack of claim 10, wherein the interconnect board is overmolded relative to the busbar to define an integral formation therebetween.

12. The battery pack of claim 11, wherein the interconnect board defines a fuse-accepting pocket formed therein to receive the at least one fuse of the voltage sense circuit.

* * * * *